United States Patent
Kishimoto et al.

(10) Patent No.: US 11,075,249 B2
(45) Date of Patent: Jul. 27, 2021

(54) METHOD FOR PRODUCING ORGANIC ELECTROLUMINESCENT DISPLAY DEVICE COMPRISING POLYDIACETYLENE LAYERS

(71) Applicant: SAKAI DISPLAY PRODUCTS CORPORATION, Sakai (JP)

(72) Inventors: Katsuhiko Kishimoto, Sakai (JP); Takuji Kato, Sakai (JP)

(73) Assignee: SAKAI DISPLAY PRODUCTS CORPORATION, Sakai (JP)

( * ) Notice: Subject to any disclaimer, the term of this patent is extended or adjusted under 35 U.S.C. 154(b) by 68 days.

(21) Appl. No.: 16/472,823

(22) PCT Filed: Jan. 31, 2018

(86) PCT No.: PCT/JP2018/003268
§ 371 (c)(1),
(2) Date: Sep. 26, 2019

(87) PCT Pub. No.: WO2019/150506
PCT Pub. Date: Aug. 8, 2019

(65) Prior Publication Data
US 2021/0143221 A1     May 13, 2021

(51) Int. Cl.
*H01L 27/32*     (2006.01)
*H01L 51/52*     (2006.01)
(Continued)

(52) U.S. Cl.
CPC ........ *H01L 27/322* (2013.01); *H01L 51/0041* (2013.01); *H01L 51/5253* (2013.01); *H01L 51/56* (2013.01); *H01L 2251/558* (2013.01)

(58) Field of Classification Search
CPC . H01L 51/5253; H01L 51/56; H01L 27/3246; H01L 2227/323; H01L 27/322; H01L 2251/558
(Continued)

(56) References Cited

U.S. PATENT DOCUMENTS 6,266,188 B1 *  7/2001  Hayashi .............. G02B 5/3083
                                                    359/489.06
7,102,282 B1    9/2006  Yamada et al.
(Continued)

FOREIGN PATENT DOCUMENTS

JP    S59-111608 A    6/1984
JP    H10-247587 A    9/1998
(Continued)

*Primary Examiner* — Thao X Le
*Assistant Examiner* — Eric W Jones
(74) *Attorney, Agent, or Firm* — ScienBiziP, P.C.

(57) ABSTRACT

This organic EL display device (100) is provided with an element substrate which comprises multiple pixels and which comprises organic EL elements (3) arranged in each pixel and bank layers (48) defining the pixels, and a thin-film sealing structure (10) which covers the pixels. The thin-film sealing structure includes a first inorganic barrier layer (12), and an organic barrier layer (14) in contact with the upper surface or lower surface of the first inorganic barrier layer. The multiple pixels include red pixels, green pixels and blue pixels, and further have a first polydiacetylene layer (52*a*) which exhibits a blue color and which is provided selectively on a second inorganic barrier layer (16) of the thin-film sealing structure on blue pixels, and a second polydiacetylene layer (52*b*) which exhibits a red color and which is provided selectively on the thin-film sealing structure on red pixels. The first and second polydiacetylene layers are a polymer of 10,12-pentacosadiynoic acid.

12 Claims, 6 Drawing Sheets

(a)

(b)

(51) Int. Cl.
*H01L 51/00* (2006.01)
*H01L 51/56* (2006.01)

(58) Field of Classification Search
USPC .......................................... 438/27; 427/296
See application file for complete search history.

(56) References Cited

U.S. PATENT DOCUMENTS

| | | | | |
|---|---|---|---|---|
| 2006/0012288 A1* | 1/2006 | Terakado | ............... | H01L 27/322 313/503 |
| 2006/0051972 A1* | 3/2006 | Chen | ................. | H01L 21/76808 438/763 |
| 2011/0122347 A1 | 5/2011 | Jarvis et al. | | |
| 2012/0021363 A1 | 1/2012 | Jarvis | | |
| 2013/0260054 A1* | 10/2013 | Gleason | ................ | G03F 7/2014 427/509 |
| 2014/0117842 A1 | 5/2014 | Hanamura | | |
| 2015/0060822 A1* | 3/2015 | Kamiya | .............. | H01L 51/5225 257/40 |
| 2015/0291754 A1* | 10/2015 | Humiston | ............... | C23C 14/20 428/195.1 |
| 2015/0329656 A1* | 11/2015 | Kim | ....................... | G01N 21/81 524/547 |
| 2016/0043151 A1* | 2/2016 | Kato | .................... | H01L 27/3246 257/40 |
| 2016/0043346 A1 | 2/2016 | Kamiya et al. | | |
| 2016/0126495 A1 | 5/2016 | Oka et al. | | |
| 2017/0250380 A1* | 8/2017 | Kato | .................... | H01L 51/5253 |
| 2017/0373274 A1 | 12/2017 | Kokame | | |

FOREIGN PATENT DOCUMENTS

| | | |
|---|---|---|
| JP | 2005-071773 A | 3/2005 |
| JP | 2009-224620 A | 10/2009 |
| JP | 2011-526702 A | 10/2011 |
| JP | 2012-516795 A | 7/2012 |
| JP | 2013-016372 A | 1/2013 |
| JP | 2014-089804 A | 5/2014 |
| JP | 2015-102811 A | 6/2015 |
| JP | 2016-039120 A | 3/2016 |
| JP | 2017-228480 A | 12/2017 |
| WO | 01/039554 A1 | 5/2001 |
| WO | 2014/196137 A1 | 12/2014 |

\* cited by examiner

METHOD FOR PRODUCING ORGANIC ELECTROLUMINESCENT DISPLAY DEVICE COMPRISING POLYDIACETYLENE LAYERS

TECHNICAL FIELD

The present invention relates to an organic EL display device and a method for producing the same.

BACKGROUND ART

Organic EL (Electroluminescence; display devices start being put into practical use. One feature of an organic EL display device is flexibility thereof. Such an organic EL display device includes, in each of pixels, at least one organic EL element (Organic Light Emitting Diode: OLED) and at least one TFT (Thin Film Transistor) controlling an electric current to be supplied to the at least one OLED. Hereinafter, an organic EL display device will be referred to as an "OLED display device". Such an OLED display device including a switching element such as a TFT or the like in each of OLEDs is called an "active matrix OLED display device". A substrate including the TFTs and the OLEDs will be referred to as an "element substrate".

An OLED (especially, an organic light emitting layer and a cathode electrode material) is easily influenced by moisture to be deteriorated and to cause display unevenness. One technology developed to provide an encapsulation structure that protects the OLED against moisture while not spoiling the flexibility of the OLED display device is a thin film encapsulation (TFE) technology. According to the thin film encapsulation technology, an inorganic barrier layer and an organic barrier layer are stacked alternately to allow such thin films to provide a sufficiently high level of water vapor barrier property. From the point of view of the moisture-resistance reliability of the OLED display device, such a thin film encapsulation structure is typically required to have a WVTR (Water Vapor Transmission Rate) lower than, or equal to, $1 \times 10^{-4}$ g/m²/day.

A thin film encapsulation structure used in OLED display devices commercially available currently includes an organic barrier layer (polymer barrier layer) having a thickness of about 5 μm to about 20 μm. Such a relatively thick organic barrier layer also has a role of flattening a surface of the element substrate. However, such a thick organic barrier layer involves a problem that the bendability of the OLED display device is limited.

Patent Document No. 1 discloses a thin film encapsulation structure including a first inorganic material layer, a first resin member and a second inorganic material layer provided on the element substrate in this order, with the first inorganic barrier layer being closest to the element substrate. In this thin film encapsulation structure, the first resin member is present locally, more specifically, in the vicinity of a protruding portion of the first inorganic material layer (first inorganic material layer covering the protruding portion). According to Patent Document No. 1, since the first resin member is present locally, more specifically, in the vicinity of the protruding portion, which may not be sufficiently covered with the first inorganic material layer, entrance of moisture or oxygen via the non-covered portion is suppressed. In addition, the first resin member acts as an underlying layer for the second inorganic material layer. Therefore, the second inorganic material layer is properly formed and properly covers a side surface of the first inorganic material layer with an expected thickness. The first resin member is formed as follows. An organic material heated and gasified to be mist-like is supplied onto an element substrate maintained at a temperature lower than, or equal to, room temperature. The organic material is condensed and put into liquid drops on the substrate. The organic material in the liquid drops moves on the substrate by a capillary action or a surface tension to be present locally, more specifically, at a border between a side surface of the protruding portion of the first inorganic barrier layer and a surface of the substrate. Then, the organic material is cured to form the first resin member at the border. Patent Document No. 2 also discloses an OLED display device including a similar thin film encapsulation structure.

The thin film encapsulation structure, described in each of Patent Documents Nos. 1 and 2, including an organic barrier layer formed of a resin member that is present locally does not include a thick organic barrier layer, and therefore, is considered to improve the bendability of the OLED display device.

In the meantime, it has been attempted to improve the color reproducibility of the OLED display device. For example. Patent Document No. 3 discloses an optical film capable of suppressing a color from looking different in accordance with the observation direction, and an OLED display device including the same.

CITATION LIST

Patent Literature

Patent Document No. 1: WO2014/196137

Patent Document No. 2: Japanese Laid-Open Patent Publication No. 2016-39120

Patent Document No. 3: Japanese Laid-Open Patent Publication No. 2015-102811

Patent Document No. 4: WO2001/39554

SUMMARY OF INVENTION

Technical Problem

However, the optical film has a problem of not being capable of optimizing the color display characteristic of each of pixels. Especially in an OLED display device having a microcavity structure, an organic EL layer (e.g., organic light emitting layer) has a thickness adjusted such that an optimal resonance is provided in each of colors of pixels (see, for example, Patent Document No. 4). However, it is difficult to adjust the length of a resonator having a microcavity structure to an optimal value for an organic EL layer for each of the colors. Therefore, there are cases where the thickness of the organic EL layer is basically set to be optimal for a green pixel, which provides light having a high luminosity factor and has an intermediate thickness. Such a thickness of the organic EL layer is shifted from an optimal value of thickness for a blue pixel and an optimal value of thickness for a red pixel, which decreases the color purity. Especially an organic EL layer in the blue pixel is thinnest and therefore, the color purity of blue is most influenced and is easily decreased.

In addition, the above-described thin film encapsulation structure including the organic barrier layer formed of a resin located locally has concaved and convexed portions at a surface thereof, and therefore, has a problem of not easily allowing an optical film to be attached thereto uniformly.

The present invention has an object of providing an organic EL display device having an improved color purity of a blue pixel and a red pixel, and a method for producing the same.

Solution to Problem

An organic EL display device according to an embodiment of the present invention includes a plurality of pixels. The organic EL display device includes an element substrate including a substrate, a plurality of organic EL elements supported by the substrate and respectively located in the plurality of pixels, and a bank layer defining the plurality of pixels; and a thin film encapsulation structure covering the plurality of pixels. The thin film encapsulation structure includes a first inorganic barrier layer and an organic barrier layer in contact with a top surface or a bottom surface of the first inorganic barrier layer. The plurality of pixels include a red pixel, a green pixel and a blue pixel. The organic EL display device further includes a first polydiacetylene layer exhibiting a blue color and a second polydiacetylene layer selectively provided on the thin film encapsulation structure on the red pixel and exhibiting a red color. The first and second polydiacetylene layers are formed of a polymer of 10,12-pentacosadiynoic acid.

In an embodiment, the organic barrier layer included in the thin film encapsulation structure is in contact with the top surface of the first inorganic barrier layer and includes a plurality of solid portions distributed discretely. The thin film encapsulation structure farther includes a second inorganic barrier layer in contact with the top surface of the first inorganic barrier layer and top surfaces of the plurality of solid portions of the organic barrier layer. The first and second polydiacetylene layers are formed on the second inorganic barrier layer.

In an embodiment, the first and second polydiacetylene layers are semiconductive.

In an embodiment, the first polydiacetylene layer has a specific resistance smaller than, or equal to, $1 \times 10^{-1}$ Ωcm.

In an embodiment, the organic EL display device further includes an ultraviolet absorbing layer located on the first and second polydiacetylene layers.

In an embodiment, the first inorganic barrier layer is formed of silicon nitride. In an embodiment, the second inorganic barrier layer is also formed of silicon nitride.

In an embodiment, the first and second polydiacetylene layers each have a thickness of 0.5 μm or greater and 2.0 μm or less.

In an embodiment, the first polydiacetylene layer provides a transmission spectrum of blue light in which the blue light has a peak wavelength in the range of 460 run or longer and 470 nm or shorter.

In an embodiment, the first polydiacetylene layer has a transmittance for the blue light higher than, or equal to, 80% at the peak wavelength thereof.

In an embodiment, the second polydiacetylene layer provides a transmission spectrum of red light in which the red light has a peak wavelength in the range of 610 nm or longer and 630 nm or shorter.

In an embodiment, the second polydiacetylene layer has a transmittance for the red light higher than, or equal to, 90% at the peak wavelength thereof.

A method for producing an organic EL display device according to an embodiment of the present invention is a method for producing the organic EL display device described in any of the above. A step of forming the first and second polydiacetylene layers includes the steps of after the thin film encapsulation structure is formed, depositing 10,12-pentacosadiynoic acid on the thin film encapsulation structure by mask vapor deposition; irradiating the 10,12-pentacosadiynoic acid with an electron beam or ultraviolet rays to form a polydiacetylene layer exhibiting a blue color; and further irradiating only a region, of the polydiacetylene layer, to be the second polydiacetylene layer with the ultraviolet, rays to change the region to a polydiacetylene layer exhibiting a red color by phase transition.

In an embodiment, the step of forming the thin film encapsulation structure includes the step of forming a silicon nitride layer. After the silicon nitride layer is formed, the 10,12-pentacosadiynoic acid is deposited by the mask vapor deposition without exposing the silicon nitride layer to the atmosphere.

In an embodiment, the step of forming the thin film encapsulation structure includes the steps of preparing, in a chamber, the element substrate on which the first inorganic barrier layer is formed, supplying a vapor-like or mist-like photocurable resin into the chamber, condensing the photocurable resin on the first inorganic barrier layer to form a liquid film, irradiating the liquid film of the photocurable resin with light to form a photocured resin layer, and partially ashing the photocured resin layer to form the organic barrier layer.

In an embodiment, the step of forming the organic barrier layer is performed by spraying, spin-coating, slit-coating, screen printing or ink-jetting.

Advantageous Effects of Invention

An embodiment of the present invention provides an organic EL display device having an improved color purity of a blue pixel and a red pixel, and a method for producing the same.

BRIEF DESCRIPTION OF DRAWINGS

FIG. 1(*a*) is a schematic partial cross-sectional view of an active region of an OLED display device 100 according to an embodiment of the present invention, and FIG. 1(*b*) is a partial cross-sectional view of a TFE structure 10 formed on an OLED 3.

FIG. 3(*a*) through FIG. 3(*c*) are each a schematic cross-sectional view of the OLED display device 100; FIG. 3(*a*) is a cross-sectional view taken along line 3A-3A' in FIG. 2, FIG. 3(*b*) is a cross-sectional view taken along line 3B-3B' in FIG. 2, and FIG. 3(*c*) is a cross-sectional view taken along line 3C-3C' in FIG. 2.

FIG. 4(*a*) is an enlarged view of a portion including a particle P shown in FIG. 3(*a*), FIG. 4(*b*) is a schematic plan view showing the size relationship among the particle P, a first inorganic barrier layer (SiN layer) covering the particle P, and an organic barrier layer; and FIG. 4(*c*) is a schematic cross-sectional view of the first inorganic barrier layer covering the particle P.

FIG. 6 provides cross-sectional views schematically showing a pixel and the bank layer 48 included in the OLED display device 100; FIG. 6(*a*) is a cross-sectional view of one of a blue pixel and a red pixel taken along one of lines 6A-6A' in FIG. 5, and FIG. 6(b) is a cross-sectional view of a green pixel taken along line 6B-6B' in FIG. 5.

DESCRIPTION OF EMBODIMENTS

Hereinafter, an OLED display device and a method for producing the same according to embodiments of the present invention will be described with reference to the drawings. The embodiments of the present invention are not limited to the embodiments that are described below as examples. For example, an organic EL display device according to an embodiment of the present invention may include, for example, a glass substrate instead of a flexible substrate.

First, with reference to FIG. 1(a) and FIG. 1(b), a basic structure of an OLED display device 100 according to an embodiment of the present invention will be described. FIG. 1(a) is a schematic partial cross-sectional view of an active region of the OLED display device 100 according to an embodiment of the present invention. FIG. 1(b) is a partial cross-sectional view of a TFE structure 10 formed on an OLED 3.

The OLED display device 100 includes a plurality of pixels, and each of the pixels includes at least one organic EL element (OLED). Herein, a structure corresponding to one OLED will be described for the sake of simplicity.

As shown in FIG. 1(a), the OLED display device 100 includes a flexible substrate (hereinafter, may be referred to simply as a "substrate") 1, a circuit (backplane) 2 formed on the substrate 1 and including a TFT, the OLED 3 formed on the circuit 2, and the TFE structure 10 formed on the OLED 3. The OLED 3 is, for example, of a top emission type. An uppermost portion of the OLED 3 is, for example, an upper electrode or a cap layer (refractive index adjusting layer). An optional polarizing plate 4 is located on the TFE structure 10.

The substrate 1 is, for example, a polyimide film having a thickness of 15 μm. The circuit 2 including the TFT has a thickness of, for example, 4 μm. The OLED 3 has a thickness of, for example, 1 μm. The TFE structure 10 has a thickness of, for example, less than, or equal to, 1.5 μm.

FIG. 1(b) is a partial cross-sectional view of the TFE structure 10 formed on the OLED 3. The TFE structure 10 includes a first inorganic barrier layer (e.g., SiN layer) 12, an organic barrier layer (e.g., acrylic resin layer) 14, and a second inorganic barrier layer (e.g., SiN layer) 16. The first inorganic barrier layer 12 is formed immediately on the OLED 3. The organic barrier layer 14 is in contact with a top surface of the first inorganic barrier layer 12, and includes a plurality of solid portions distributed discretely. The second inorganic barrier layer 16 is in contact with the top surface of the first inorganic barrier layer 12 and top surfaces of the plurality of solid portions of the organic barrier layer 14. The organic barrier layer 14 is transparent (having a visible light transmittance of 95% or higher when having a thickness of 1 μm).

For example, the first inorganic barrier layer 12 and the second inorganic barrier layer 16 are each an SiN layer (e.g., $Si_3N_4$ layer) having a thickness of, for example, 400 nm. The thicknesses of the first inorganic barrier layer 12 and the second inorganic barrier layer 16 are each independently 200 nm or greater and 1000 nm or less. The TFE structure 10 has a thickness of, preferably, 400 nm or greater and less than 2 μm, and more preferably, 400 nm or greater and less than 1.5 nm. The thickness of the organic barrier layer 14, which depends on the size of a protruding portion at the surface of the first inorganic barrier layer 12 or the size of the particle, may be about 1 μm at the maximum. The thickness of the organic barrier layer 14 is typically 200 nm or greater and 500 nm or less.

The TFE structure 10 is formed to protect an active region (see an active region R1 in FIG. 2) of the OLED display device 100. As described above, the TFE structure 10 includes the first inorganic barrier layer 12, the organic barrier layer 14 and the second inorganic barrier layer 16 provided in this order on at least the active region, with the first inorganic barrier layer 12 being closest to the OLED 3. The organic barrier layer 14 is not present as a film covering the entirety of the active region, but includes an opening. A portion of the organic barrier layer 14 excluding the opening, more specifically, a portion where the organic film is actually present, will be referred to as a "solid portion". The opening (may also be referred to as a "non-solid portion") does not need to be enclosed by the solid portion, and the opening includes a cut-out portion or the like. In the opening, the first inorganic barrier layer 12 and the second inorganic barrier layer 16 are in direct contact with each other. The opening of the organic barrier layer 14 includes at least an opening formed to enclose the active region, and the active region is completely enclosed by the portion in which the first inorganic barrier layer 12 and the second inorganic barrier layer 16 are in direct contact with each other (hereinafter, such a portion will be referred to as an "inorganic barrier layer joint portion").

With reference to FIG. 2 through FIG. 6, a structure of an OLED display device and a method for producing the same according to an embodiment of the present invention will be described.

Figure 2:
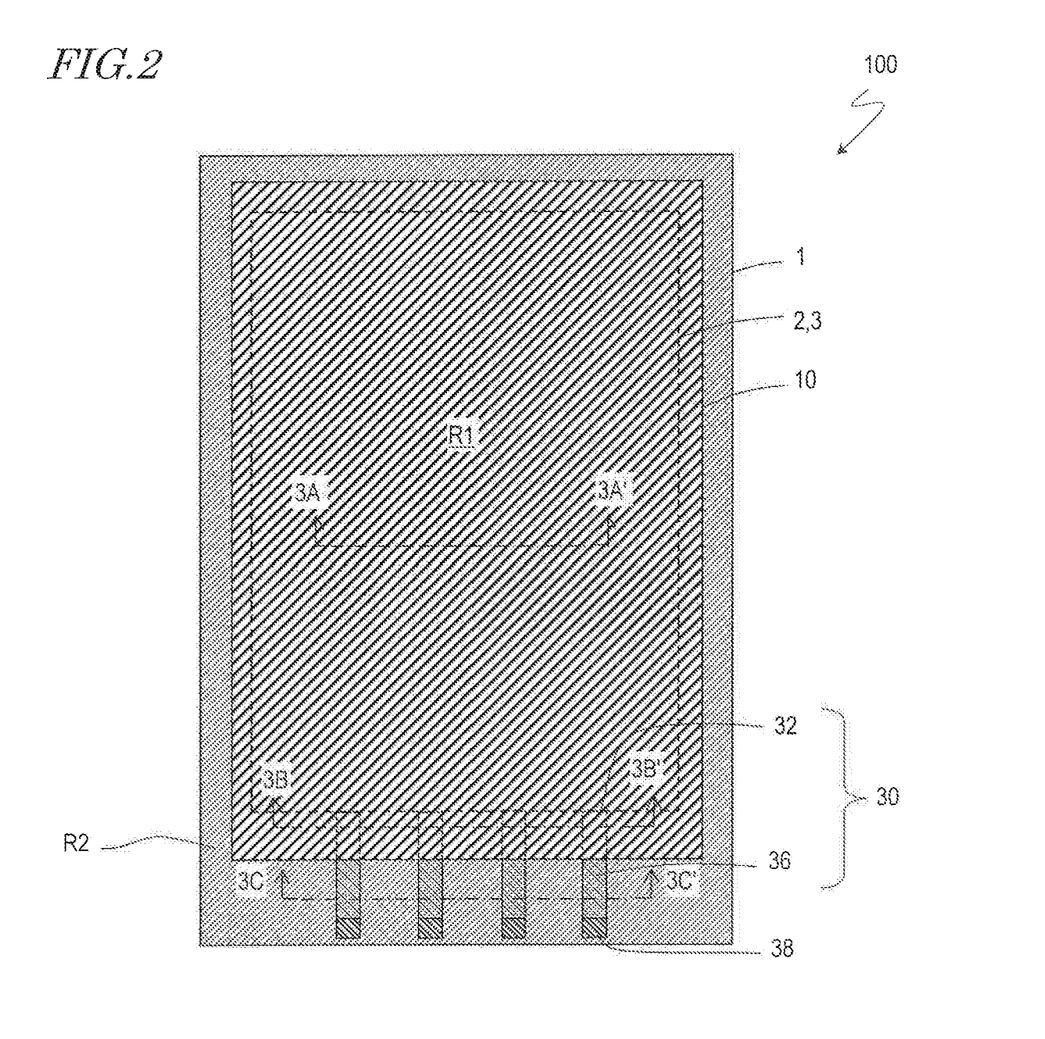
FIG. 2 is a plan view schematically showing a structure of the OLED display device 100 according to embodiment 1 of the present invention.

FIG. 2 is a schematic plan view of the OLED display device 100 according to an embodiment of the present invention.

Figure 1:
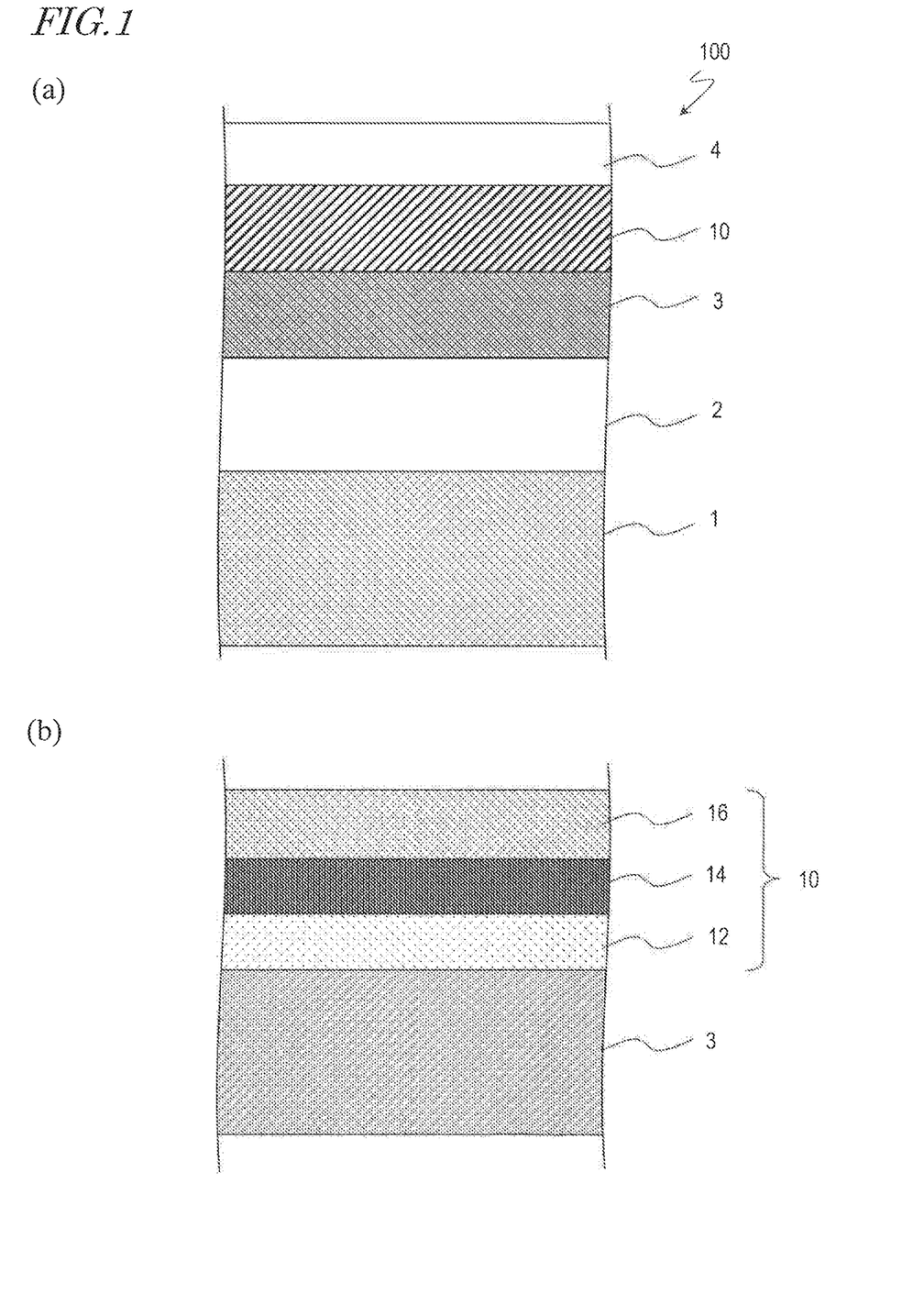

The OLED display device 100 includes the flexible substrate 1, the circuit (backplane) 2 formed on the flexible substrate 1, a plurality of the OLEDs 3 formed on the circuit 2, and the TFE structure 10 formed on the OLEDs 3. A layer including the plurality of OLEDs 3 may be referred to as an "OLED layer 3". The circuit 2 and the OLED layer 3 may share a part of components. The optional polarizing plate (see reference sign 4 in FIG. 1) may further be located on the TFE structure 10. In addition, for example, a layer having a touch panel function may be located between the TFE structure 10 and the polarizing plate. Namely, the OLED display device 100 may be altered to a display device including an on-cell type touch panel.

The circuit 2 includes a plurality of TFTs (not shown), and a plurality of gate bus lines (not shown) and a plurality of source bus lines (not shown) each connected to either one of the plurality of TFTs (not shown). The circuit 2 may be a known circuit that drives the plurality of OLEDs 3. The plurality of OLEDs 3 are each connected with either one of the plurality of TFTs included in the circuit 2. The OLEDs 3 may be known OLEDs.

The OLED display device 100 further includes a plurality of terminals 38 located in a peripheral region R2 outer to the active region (region enclosed by the dashed line in FIG. 2) R1, where the plurality of OLEDs 3 are located, and also includes a plurality of lead wires 30 each connecting either one of the plurality of terminals 38 and either one of the plurality of gate bus lines or either one of the plurality of source bus lines to each other. The TFE structure 10 is formed on the plurality of OLEDs 3 and on portions of the plurality of lead wires 30, the portions being closer to the active region R1. Namely, the TFE structure 10 covers the entirety of the active region R1 and is also selectively formed on the portions of the plurality of lead wires 30 that are closer to the active region R1. Neither portions of the plurality of lead wires 30 that are closer to the terminals 38, nor the terminals 38, are covered with the TFE structure 10.

Hereinafter, an example in which the lead wires 30 and the terminals 38 are integrally formed of the same conductive layer will be described. Alternatively, the lead wires 30 and the terminals 38 may be formed of different conductive layers (encompassing stack structures).

Now, with reference to FIG. 3(a) through FIG. 3(c), the TFE structure 10 of the OLED display device 100 will be described. FIG. 3(a) is a cross-sectional view taken along line 3A-3A' in FIG. 2. FIG. 3(b) is a cross-sectional view taken along line 3B-3B' in FIG. 2. FIG. 3(c) is a cross-sectional view taken along line 3C-3C' in FIG. 2.

As shown in FIG. 3(a) and FIG. 3(b), the TFE structure 10 includes the first inorganic barrier layer 12 formed on the OLED 3, the organic barrier layer 14, and the second inorganic barrier layer 16 in contact with the first inorganic barrier layer 12 and the organic barrier layer 14. The first inorganic barrier layer 12 and the second inorganic barrier layer 16 are each, for example, an SiN layer, and are each selectively formed only in a predetermined region by plasma CVD by use of a mask so as to cover the active region R1. In general, a surface of a layer formed by a thin film deposition method (e.g., CVD, sputtering, vacuum vapor deposition) reflects a stepped portion in an underlying layer. The organic barrier layer (solid portion) 14 is formed only in the vicinity of the protruding portion at the surface of the first inorganic barrier layer 12.

FIG. 3(a) is a cross-sectional view taken along line 3A-3A' in FIG. 2, and shows a portion including a particle P. The particle P is a microscopic dust particle generated during the production of the OLED display device, and is, for example, a microscopic piece of broken glass, a metal particle or an organic particle. Such a particle P is generated especially easily in the case where mask vapor deposition is used.

As shown in FIG. 3(a), the organic barrier layer (solid portion) 14 may include a portion 14b formed in the vicinity of the particle P. A reason for this is that an acrylic monomer supplied after the first inorganic barrier layer 12 is formed is condensed and present locally, more specifically, in the vicinity of a surface of a first inorganic barrier layer 12a on the particle P (the surface has a tapering angle larger than 90 degrees). The organic barrier layer 14 includes the opening (non-solid portion) on a flat portion of the first inorganic barrier layer 12.

Now, with reference to FIG. 4(a) through FIG. 4(c), a structure of the portion including the particle P will be described. FIG. 4(a) is an enlarged view of the portion including the particle P shown in FIG. 3(a). FIG. 4(b) is a schematic plan view showing the size relationship among the particle P, the first inorganic barrier layer (SiN layer) 12 covering the particle P, and the organic barrier layer 14. FIG. 4(c) is a schematic cross-sectional view of the first inorganic barrier layer covering the particle P.

As shown in FIG. 4(c), in the case where the particle (having a diameter, for example, longer than, or equal to, 1 μm) P is present, a crack (defect) 12c may be formed in the first inorganic barrier layer 12. As described below, this is considered to be caused by impingement of the SiN layer 12a growing from a surface of the particle P and an SiN layer 12b growing from a flat portion of a surface of the OLED 3. In the case where such a crack 12c is present, the level of barrier property of the TFE structure 10 is decreased.

In the TFE structure 10 of the OLED display device 100, as shown in FIG. 4(a), the organic barrier layer 14 is formed to fill the crack 12c of the first inorganic barrier layer 12, and a surface of the organic barrier layer 14 couples the surface of the first inorganic barrier layer 12a on the particle P and a surface of the first inorganic barrier layer 12b on the flat portion of the OLED 3 to each other continuously and smoothly. The organic barrier layer 14 is formed by curing a photocurable resin in a liquid state as described below, and therefore, has a recessed surface formed by a surface tension. In this state, the photocurable resin exhibits a high level of wettability to the first inorganic barrier layer 12. If the level of wettability of the photocurable resin to the first inorganic barrier layer 12 is low, the surface of the organic barrier layer 14 may protrude, instead of being recessed. The organic barrier layer 14 may also be formed as a thin film on the surface of the first inorganic barrier layer 12a on the particle P.

The organic barrier layer (solid portion) 14 having the recessed surface couples the surface of the first inorganic barrier layer 12a on the particle P and the surface of the first inorganic barrier layer 12b on the flat portion to each other continuously and smoothly. Therefore, the second inorganic barrier layer 16 formed thereon is a fine film with no defect. As can be seen, even if the particle P is present, the organic barrier layer 14 keeps high the level of barrier property of the TFE structure 10.

As shown in FIG. 4(b), the organic barrier layer 14 (solid portion) is formed in a ring shape around the particle P. Where the particle P has a diameter (equivalent circle diameter) of about 1 μm as seen in a direction normal to the surface of the OLED 3, the ring-shaped solid portion has a diameter (equivalent circle diameter) $D_0$ that is, for example, longer than, or equal to, 2 μm.

In this example, the organic barrier layer 14 is formed only in a discontinuous portion in the first inorganic barrier layer 12 formed on the particle P, and the particle P is already present before the first inorganic barrier layer 12 is formed on the OLED 3. Alternatively, the particle P may be present on the first inorganic barrier layer 12. In this case, the organic barrier layer 14 is formed only at the border, namely, in a discontinuous portion, between the first inorganic barrier layer 12 and the particle P on the first inorganic barrier layer 12, and thus maintains the level of barrier property of the TFE structure 10 like in the above-described case. The organic barrier layer 14 may also be formed as a thin film on the surface of the first inorganic barrier layer 12a on the particle P, or on the surface of the particle P. In this specification, the expression that "the organic barrier layer 14 is present in the vicinity of the particle P" encompasses all these forms.

The organic barrier layer (solid portion) 14 is not limited to being formed as in the example of FIG. 3(a), and may be formed only in the vicinity of the protruding portion at the surface of the first inorganic barrier layer 12 for substantially the same reason as that described above. Examples of other regions where the organic barrier layer (solid portion) 14 may be formed will be described below.

Now, with reference to FIG. 3(b), a structure of the TFE structure 10 on the lead wires 30 will be described. FIG. 3(b) is a cross-sectional view taken along line 3B-3B' in FIG. 2, more specifically, is a cross-sectional view of portions 32 of the lead wires 30, the portions 32 being closer to the active region R1.

As shown in FIG. 3(b), the organic barrier layer (solid portion) 14 includes a portion 14c formed in the vicinity of each of the protruding portions at the surface of the first inorganic barrier layer 12, the protruding portions reflecting the cross-sectional shape of the portions 32 of the lead wires 30.

Figure 3:
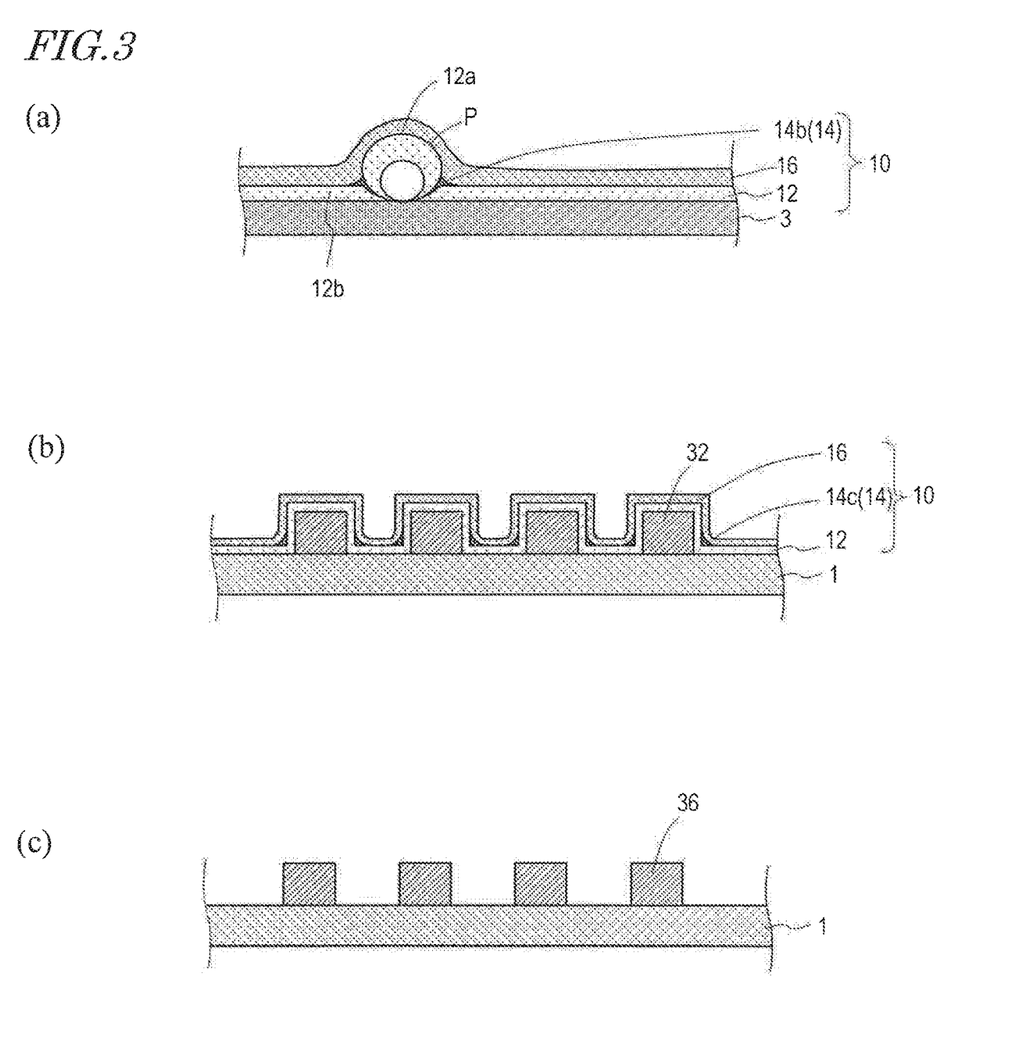
Figure 4:
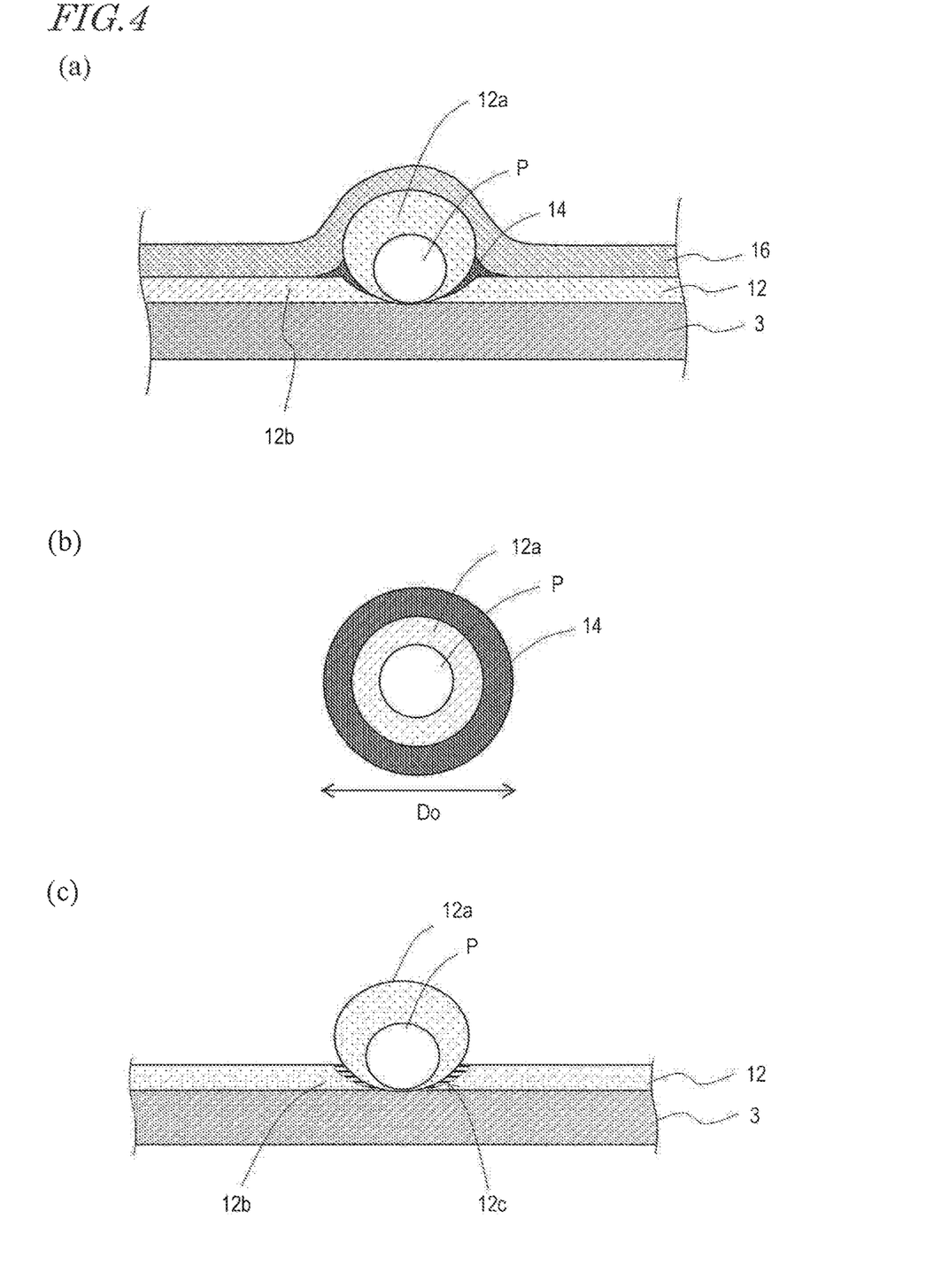

The lead wires 30 are patterned by the same step as that of, for example, the gate bus lines or the source bus lines. Therefore, in the example described below, the gate bus lines and the source bus lines formed in the active region R1 also have the same cross-sectional structure as that of the portions 32 shown in FIG. 3(*b*), of the lead wires 30, closer to the active region R1. It should be noted that typically, a flattening layer is formed on the gate bus lines and the source bus lines formed in the active region R1, and thus no stepped portion is formed at the surface of the first, inorganic barrier layer 12 on the gate bus lines and the source bus lines.

The portions 32 of the lead wires 30 may each have, for example, a forward tapering side surface portion (inclining side surface portion) having a tapering angle smaller than 90 degrees. In the case where the lead wires 30 each include the forward tapering side surface portion, formation of defects in the first inorganic barrier layer 12 and the second inorganic barrier layer 16 formed on the lead wires 30 is prevented. Namely, the moisture-resistance reliability of the TFE structure 10 is improved. The tapering angle of the forward tapering side surface portion is preferably smaller than, or equal to, 70 degrees.

The active region R1 of the OLED display device 100, except for the regions where the organic barrier layer 14 is selectively formed, is substantially covered with the inorganic barrier layer joint portion, in which the first inorganic barrier layer 12 and the second inorganic barrier layer 16 are in direct contact with each other. Therefore, it does not occur that the organic barrier layer 14 acts as a moisture entrance route to allow the moisture to reach the active region R1 of the OLED display device.

The OLED display device 100 according to an embodiment of the present invention is preferably usable for, for example, medium- to small-sized high-definition smartphones and tablet terminals. In a medium- to small-sized (e.g., 5.7-inch) high-definition (e.g., 500 ppi) OLED display device, it is preferred that the lines (encompassing the gate bus lines and the source bus lines) in the active region R1 have a cross-sectional shape, in a direction parallel to a line width direction thereof, close to a rectangle (side surfaces of the lines have a tapering angle of about 90 degrees) in order to have a sufficiently low resistance with a limited line width. Therefore, in order to form the lines having a low resistance, the tapering angle of the forward tapering side surface portion TSF may be larger than 70 degrees and smaller than 90 degrees, or the tapering angle of the lines may be about 90 degrees in the entire length of the lines with no forward tapering side surface portion TSF being provided.

Now, FIG. 3(*c*) will be referred to. FIG. 3(*c*) is a cross-sectional, view of a region where the TFE structure 10 is not formed. In this region, the terminals 38 have the same cross-sectional structure as that of portions 36 of the lead wires 30 shown in FIG. 3(*c*). The portions 36 of the lead wires 30 shown in FIG. 3(*c*) may have a tapering angle of, for example, 90 degrees.

Now, with reference to FIG. 5 and FIG. 6, the organic barrier layer 14 formed in the vicinity of a bank structure BS will be described. The organic barrier layer (solid portion) 14 is also formed in the vicinity of a protruding portion at the surface of the first inorganic barrier layer 12, the protruding portion being used to form the bank structure BS.

Figure 5:
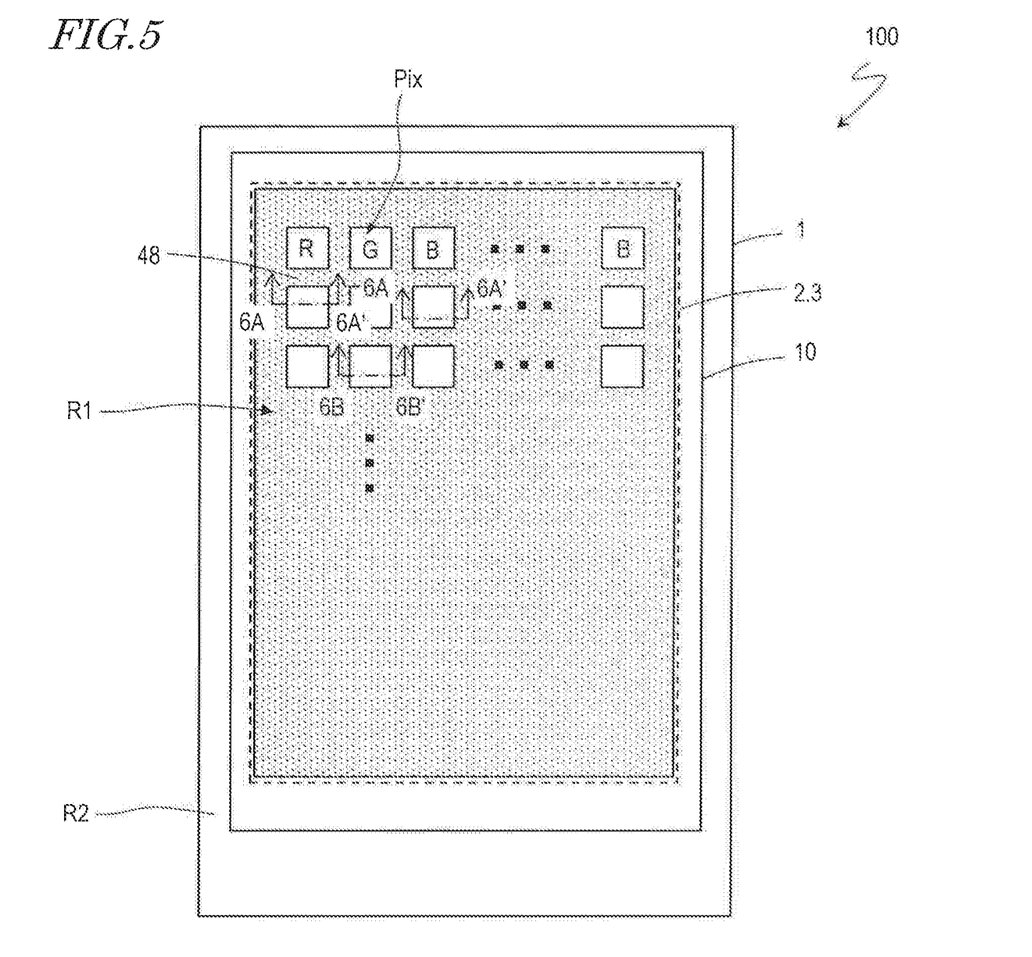
FIG. 5 is a plan view schematically showing a bank layer 48 included in the OLED display device 100.

FIG. 5 is a plan view schematically showing the plurality of pixels and a bank layer 48 included in the OLED display device 100. The OLED display device 100 includes red pixels R, green pixels G and blue pixels B. In this example, the pixels of the three primary colors are arrayed in stripes. The pixels are not limited to being arrayed in this manner. FIG. 6(*a*) is a cross-sectional view of one of a blue pixel and a red pixel taken along one of lines 6A-6A' in FIG. 5. FIG. 6(*b*) is a cross-sectional view of a green pixel taken along line 6B-6B' in FIG. 5.

Figure 6:
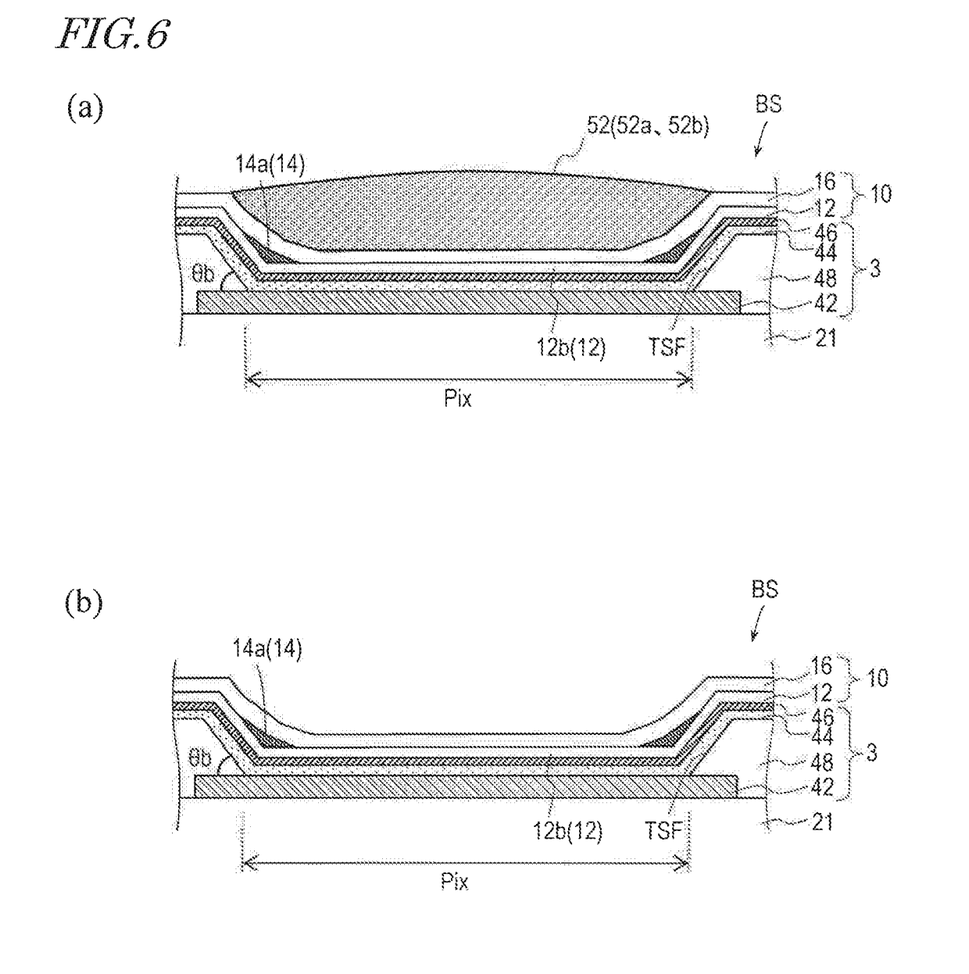

As shown in FIG. 6(*a*), the OLED display device 100 further includes the bank structure BS defining the plurality of pixels. The bank layer BS has an inclining surface enclosing each of the plurality of pixels. The plurality of solid portions of the organic barrier layer 14 include a pixel periphery solid portion 14*a* extending on the first inorganic barrier layer 12 from an inclining surface to a peripheral area in the pixel.

As shown in FIG. 6(*a*), the bank structure BS includes the bank layer (may be referred to also as a "PDL (Pixel Defining Layer") 48 formed of an insulating material. The bank layer 48 is formed between a lower electrode 42 and an organic layer 44 of the OLED 3. As shown in FIG. 6(*a*), the OLED 3 includes the lower electrode 42, the organic layer 44 formed on the lower electrode 42, and an upper electrode 46 formed on the organic layer 44. In this example, the lower electrode 42 and the upper electrode 46 respectively act as an anode and a cathode of the OLED 3. The upper electrode 46 is a common electrode formed for the entirety of the pixels in the active region. By contrast, the lower electrode (pixel electrode) 42 is formed for each of the pixels. In the structure in which the bank layer 48 is present between the lower electrode 42 and the organic layer 44, no holes are injected from the lower electrode 42 into the organic layer 44. Therefore, the region where the bank layer 48 is present does not act as a pixel. Pix. For this reason, the bank layer 48 defines an outer perimeter of the pixel Pix.

As shown in FIG. 5, the pixels Pix are respectively defined by openings in the bank layer 48. The bank layer 48 is formed to be, for example, lattice-shaped. A side surface of each of the openings of the bank layer 48 has an inclining surface including the forward tapering side surface portion TSF. The inclining surface of the bank layer 48 encloses the corresponding pixel. The bank layer 48 is formed of, for example, a photosensitive resin (e.g., polyimide or acrylic resin). The bank layer 48 has a thickness of, for example, 1 µm to 2 µm. The inclining surface of the bank layer 48 is inclined at an inclination angle θb that is smaller than, or equal to, 60 degrees. If the inclination angle θb of the inclining surface of the bank layer 48 is larger than 60 degrees, a defect may be caused in layers located on the bank layer 48. The layers located on the bank layer 48 (including, for example, the organic layer 44, the upper electrode 46, the first inorganic barrier layer 12 and the second inorganic barrier layer 16) may be included in the bank structure BS. The layers included in the bank structure BS may each have an inclining surface enclosing each of the plurality of pixels. In the case where the layers formed on the bank layer 48 are all thinner than the bank layer 48, the inclining surface of the bank structure BS is considered to have an inclination angle substantially equal to the inclination angle θb of the inclining surface of the bank layer 48. The first inorganic barrier layer 12 is included in the bank structure BS, and has the inclining surface enclosing each of the plurality of pixels. The organic barrier layer (solid portion) 14 includes the pixel periphery solid portion 14*a* extending on the first inorganic barrier layer 12 from the inclining surface to a peripheral area in the pixel.

In the case where the pixel periphery solid portion 14a is formed, as described in PCT/JP2017/046472, an OLED display device having a higher front luminance and a higher directivity than those of a conventional OLED display device is provided. The entirety of the disclosure of PCT/JP2017/046472 is incorporated herein by reference.

In a central area of each pixel, the organic barrier layer 14 is formed only in a discontinuous portion formed in the first inorganic barrier layer 12 by the particle P. Namely, the organic barrier layer 14 is not present in a region, of the central area of the pixel, where no particle P is present. The OLED display device with no particle P does not include the organic barrier layer in the central area of the pixel. The particle P has a size (equivalent spherical diameter) of typically 0.3 μm or longer and 5 μm or shorter. A substrate of G4.5 (730 mm×920 mm) may include, for example, several tens to about 100 particles. One OLED display device (active region) may include approximately several particles. Needless to say, there are OLED display devices with no particle P. The organic barrier layer 14 is formed of, for example, a photo-cured resin formed by curing a photocurable resin. A portion where the photocurable resin is actually present is referred to as a "solid portion". As described above, the organic barrier layer 14 (solid portion) is selectively formed only in the vicinity of the protruding portion at the surface of the first inorganic barrier layer 12.

In the case where there is a particle P in the central area of the pixel, the organic barrier layer 14 is formed in a discontinuous portion formed by the particle P. As described above with reference to FIG. 4(b), the organic barrier layer (solid portion) 14 is formed in a ring shape around the particle P. Where the particle P has a diameter (equivalent circle diameter) of, for example, about 1 μm as seen in a direction normal to the surface of the OLED 3, the ring-shaped solid portion has a diameter (equivalent circle diameter) $D_0$ that is, for example, longer than, or equal to, 2 μm. In the case of, for example, a 5.7-inch display device having 2560×1440 pixels (about 500 ppi), the pixel pitch is 49 jam. The size of the particle P and the size of the organic barrier layer (solid portion) 14 formed in the vicinity of the particle P are sufficiently smaller than the pixel pitch. Therefore, a change in the transmittance caused by the organic barrier layer 14 (solid portion) formed in the vicinity of the particle P does not have a significant influence on the display.

The organic barrier layer 14 may be formed by, for example, the method described in Patent Document No. 1 or 2 mentioned above. For example, in a chamber, a vapor-like or mist-like organic material (e.g., acrylic monomer) is supplied onto an element substrate maintained at a temperature lower than, or equal to, room temperature and is condensed on the element substrate. The organic material put into a liquid state is located locally, more specifically, at the border between the side surface of the protruding portion of, and the flat portion of, the first inorganic barrier layer 12 by a capillary action or a surface tension of the organic material. Then, the organic material is irradiated with, for example, ultraviolet rays to form the solid portion of the organic barrier layer (e.g., acrylic resin layer) 14 at the above-mentioned border in the vicinity of the protruding portion. The organic barrier layer 14 formed by this method does not substantially include the solid portion on the flat portion. Regarding the method for forming the organic barrier layer, the disclosures of Patent Documents Nos. 1 and 2 are incorporated herein by reference. During the formation, for example, the viscosity of the photocurable resin, and the wettability of the photocurable resin to the inclining surface of the bank layer are controlled such that a liquid film is formed on the inclining surface. The surface of the inclining surface may be modified. The thickness of the resin layer to be formed first may be adjusted (e.g., to less than 100 nm), and/or ashing conditions (including time) may be adjusted, to form the organic barrier 14.

In this example, the particles are present below the first inorganic barrier layer 12. Also in the case where the particles are present above the first inorganic barrier layer 12, the organic barrier 14 including a plurality of solid portions distributed discretely only in discontinuous portions formed by the particles may be formed in substantially the same manner.

In the case where the particle P has a size (sphere equivalent diameter) of generally 0.3 μm or longer and 5 μm or shorter, the moisture-resistance reliability of the TEE structure 10 is decreased. One OLED display device (active region) may include several particles P having such a size or may have no particle P. As described in PCT/JP2017/042913 applied by the present applicant, an organic barrier layer including solid portions distributed discretely only in discontinuous portions formed by the particles may be formed by ink-jetting. A particle having a size exceeding 5 μm is removed by washing or the like.

Namely, the step of forming the thin film encapsulation structure covering a plurality of organic EL elements included in the element substrate includes a step of forming the first inorganic barrier layer; a step of, after this step, detecting the particles below or above the first inorganic barrier layer to acquire position information on each of the particles; a step of, based on the acquired position information, attaching a microscopic liquid drop of a coating liquid containing a photocurable resin to each of the particles by ink-jetting; a step of, after this step, irradiating the photocurable resin with ultraviolet rays to cure the photocurable resin and thus forming the organic barrier layer; and a step of, after this step, forming the second inorganic barrier layer on the first inorganic barrier layer and the organic barrier layer. A photocured resin layer formed by curing the photocurable resin may be partially ashed.

An inkjet head that ejects microscopic liquid drops, each having a volume in the order of 1 fL (1 fL or larger and smaller than 10 fL) or a volume smaller than 1 fL is preferably usable. 1 fL corresponds to the volume of a sphere having a diameter of about 1.2 μm, and 0.1 fL corresponds to the volume of a sphere having a diameter of about 0.6 μm. For example, an inkjet device (Super Inkjet (registered trademark)) produced by SIJ Technology Inc., capable of ejecting 0.1 fL microscopic liquid drops, is preferably usable. The entirety of the disclosure of PCT/JP2017/042913 is incorporated herein by reference.

The organic barrier layer 14 may be formed by, for example, spraying, spin-coating, slit-coating, screen printing or ink-jetting. The method for forming the organic barrier layer 14 may further include an ashing step. The organic barrier layer may be formed of a photocurable resin and exposed to light through a mask. The organic barrier layer may be exposed to light through a mask to form a pixel periphery solid portion and also to form an inorganic barrier layer joint portion, where the first inorganic barrier layer and the second inorganic barrier layer are in direct contact with each other.

The TFE structure is not limited to including the above-described organic barrier layer including the solid portions distributed discretely. The TFE structure may include a relatively thick organic barrier layer (e.g., having a thickness of about 5 μm to about 20 μm) acting also as a flattening layer. The relatively thick organic barrier layer is typically formed on the entirety of the active region by ink-jetting. For example, a dam (wall) enclosing the entirety of the active region is formed, and an organic material to be formed into the organic barrier layer is provided by inkjet ting into the region defined by the dare (wall). The organic barrier layer formed on the entirety of the active region is enclosed by the inorganic barrier layer joint portion. The inorganic barrier layer joint portion is formed on, for example, a side surface and/or a top surface of the dam (wall). In the case where such a relatively thick organic barrier layer is formed, the first inorganic barrier layer may be omitted.

As the first inorganic barrier layer and the second inorganic barrier layer, a silicon nitride ($Si_3N_4$) layer, which has a high level of barrier property, is preferably usable. It is especially preferred to use a silicon nitride layer having a refractive index of 1.80 or higher and 1.90 or lower. An $SiO_2$ layer, an SiON layer, an SiNO layer, an $Al_2O_3$ layer or the like is usable instead of the $Si_3N_4$ layer.

As schematically shown in FIG. 6(a), the OLED display device 100 according to an embodiment of the present, invention further includes a first polydiacetylene layer 52a selectively provided on the second inorganic barrier layer 16 of the TFE 10 on the blue pixel and exhibiting a blue color, and a second polydiacetylene layer 52b selectively provided on the second inorganic barrier layer 16 of the TFE 10 on the red pixel and exhibiting a red color. The first polydiacetylene layer 52a exhibiting a blue color narrows the spectral width of blue light emitted by an organic light emitting layer in the blue pixel, and transmits the blue light; at a high transmittance. Namely, the first polydiacetylene layer 52a exhibiting a blue color improves the color purity of the blue color. For example, the polydiacetylene layer 52a provides a transmission spectrum of the blue light in which the blue light has a peak wavelength (wavelength at which the transmittance is highest) in a range of about 460 run or longer and about 470 nm or shorter, and has a transmittance for the blue light higher than, or equal to, 80% at the peak wavelength. The polydiacetylene layer 52a exhibiting a blue color may be provided, so that the color purity of the blue color, which is decreased by variance in the thickness of the organic light emitting layer in the blue pixel, is suppressed from decreasing.

The second polydiacetylene layer 52b exhibiting a red color narrows the spectral width of red light emitted by an organic light emitting layer in the red pixel, and transmits the red light at a high transmittance. Namely, the second polydiacetylene layer 52b exhibiting a red color improves the color purity of the red color. For example, the second polydiacetylene layer 52b provides a transmission spectrum of the red light in which the red light has a peak wavelength (wavelength at which the transmittance is highest) in a range of about 610 run or longer and about 630 nm or shorter, and has a transmittance for the red light higher than, or equal to, 90% at the peak wavelength. The second layer 52b exhibiting a red color may be provided, so that the color purity of the red color, which is decreased by variance in the thickness of the organic light emitting layer in the red pixel, is suppressed from decreasing.

By contrast, as schematically shown in FIG. 6(b), the green pixel does not include the polydiacetylene layer 52.

The first polydiacetylene layer 52a exhibiting a blue color and the second first polydiacetylene layer 52b exhibiting a red color are formed of a polymer of 10,12-pentacosadiynoic acid. As well known, a polymer of 10,12-pentacosadiynoic acid may exhibit a blue color or a red color in accordance with the length of the conjugated chain. For example, 10,12-pentacosadiynoic acid is irradiated with an electron beam or ultraviolet rays, so that polydiacetylene exhibiting a blue color is obtained. The obtained polydiacetylene may be further irradiated with the ultraviolet rays to become polydiacetylene exhibiting a red color by phase transition. Such phase transition is considered to occur because the effective length of the conjugated chain is shortened by the further irradiation with the ultraviolet rays. Instead of being further irradiated with the ultraviolet rays, the polydiacetylene exhibiting a blue color may be irradiated with, for example, infrared rays (e.g., infrared laser light) to be heated to a temperature of 60° C. or higher and 80° C. or lower. In this manner also, the polydiacetylene exhibiting a red color is obtained.

The first polydiacetylene layer 52a and the second polydiacetylene layer 52b are formed as follows, for example.

After the second inorganic barrier layer 16 of the TFE structure 10 is formed, 10,12-pentacosadiynoic acid (hereinafter, referred to simply as "PCDA") is deposited by, for example, mask vapor deposition on the second inorganic; barrier layer 16 without exposing the second inorganic barrier layer 16 to the atmosphere. PCDA is deposited in the state where the vacuum degree in the chamber is set to, for example, lower than, or equal to, $10^{-3}$ Pa and the temperature of the second inorganic barrier layer 16 is maintained at, for example, 50° C. The vacuum vapor deposition is used to deposit PCDA because in this manner, a film having a relatively high degree of orientation is provided. From the point of view of the degree of orientation, it is preferred that the underlying layer is an SiN layer.

After this, PCDA is irradiated with an electron beam or ultraviolet rays (e.g., 250 nm or shorter) to polymerize PCDA. As a result, the polydiacetylene layer exhibiting a blue color is obtained. The transmission spectrum through the polydiacetylene layer may be adjusted by the conditions of irradiation (intensity and time) with the electron beam or the ultraviolet rays. The relationship between the irradiation conditions and the transmission spectrum may be found in advance regarding the electron beam or the ultraviolet ray to be used, so that a polydiacetylene layer providing an intended transmission spectrum is obtained easily. It is preferred that the polydiacetylene layer has a thickness of, for example, 0.5 μm or greater and 2.0 μm or less.

In the case where the electron beam is used to polymerize PCDA, the polymerization may be performed with a polymerization device. The polymerization device has, in a vacuum chamber, a cathode (electron gun) and a focusing coil that provide the electron beam, and a polarizing coil at one side, and a stage acting as an anode at the other side. A substrate on which the OLED display device 100 is formed is transported into the polymerization device and set on the stage. After this, the substrate is scanned with the electron beam. In this manner, the polymerization is performed.

Instead of the stage, the upper electrode 46 of the OLED display device 100 may be used as the anode. From the point of view of the mass-productivity and the cost, it is more preferred to use an ultraviolet irradiation device for the polymerization.

The polydiacetylene layer exhibiting a blue color that is obtained as described above is used as the first polydiacetylene layer 52a for the blue pixel.

Next, the second polydiacetylene layer 52b for the red pixel is produced in a part of the polydiacetylene layer. In only a region, of the polydiacetylene layer exhibiting a blue color, corresponding to the red pixel, namely, only a region to become the second polydiacetylene layer 52b, is further irradiated with the ultraviolet rays. As a result, the region becomes a polydiacetylene layer exhibiting a red color by phase transition. The amount of the ultraviolet rays required for the phase transition may be found based on the relationship between the irradiation conditions and the transmission spectrum. In this manner, a polydiacetylene layer providing an intended transmission spectrum may be easily obtained.

PCDA is of a chemical formula $C_{25}H_{42}O_2$ and has a molecular weight of 374.60. Formula 1 is the structural formula of PCDA.

[Formula 1]

For example, the red pixels in the OLED display device 100 emit light having a wavelength of 600 nm or longer and 690 nm or shorter. The green pixels emit light having a wavelength of 500 nm or longer and 590 nm or shorter. The blue pixels emit light having a wavelength of 400 nm or longer and 490 nm or shorter.

In order to discuss the color reproducibility, the DCI (Digital Cinema Initiatives) specifications and the sRGB specifications will be compared against each other. Specifically, the chromaticity coordinates of the blue pixels are the same in both of the specifications. Namely, it is preferred that the chromaticity coordinates of the blue pixels are within the range of desirable values (x=0.150, y=0.060, peak wavelength=about 460 nm or longer and about 470 nm or shorter).

As described above, the wavelength of light emitted by the blue pixels may undesirably be out of the above-mentioned wavelength range due to a shift of the thickness of the organic EL layer (e.g., organic light emitting layer) from an optimal value of thickness. The first polydiacetylene layer 52a described above absorbs the light that is out of the above-mentioned wavelength range and transmits blue light in the above-described wavelength range at a high transmittance. Therefore, the wavelength of the light emitted by the blue pixels is within a desired range regardless of the thickness of the organic EL layer. As a result, an OLED display device having an improved color purity of the blue pixels is produced regardless of the production variance of the OLED display device.

Similarly, it is preferred that the chromaticity coordinates of the red pixels are within the range of desirable values (x=0.680 or larger and 0.708 or smaller, y=0.292 or larger and 0.320 or smaller, peak wavelength=about 610 nm or longer and about 630 nm or shorter).

As described above, the wavelength of the light emitted by the red pixels may undesirably be shifted from the above-described wavelength range due to a shift of the thickness of the organic EL layer (e.g., organic light emitting layer) from an optimal value of thickness. The second polydiacetylene layer 52b described above absorbs the light that is out of the above-mentioned wavelength range and transmits red light in the above-described wavelength range at a high transmittance. Therefore, the wavelength of the light emitted by the red pixels is within a desired range regardless of the thickness of the organic EL layer. As a result, an OLED display device having an improved color purity of the red pixels is produced regardless of the production variance of the OLED display device.

When ultraviolet rays are incident on the first polydiacetylene layer 52a and the second polydiacetylene layer 52b, the polymerization degree (conjugated chain length) may undesirably be changed to change the transmission spectrum. Therefore, under certain use environments of the OLED display device 100, it is preferred to provide an ultraviolet absorbing layer on the first polydiacetylene layer 52a and the second polydiacetylene layer 52b. The ultraviolet absorbing layer may be a known layer such as, for example, a titanium oxide layer or the like. In the case where, for example, the OLED display device 100 includes a circular polarizing plate, a material absorbing ultraviolet rays may be used for a resin layer included in the circular polarizing plate.

In the case where mask vapor deposition is used, the polydiacetylene layers 52 (52a and 52b) may be formed selectively only on the blue pixels and the red pixels. The polydiacetylene layers 52 are not limited to being formed in this manner. A solution of PCDA may be used to form the polydiacetylene layers 52 selectively only on the blue pixels and the red pixels by ink-jetting. The solution has a concentration of, for example, 0.1% by mass. The rate at which the solvent is removed may be adjusted, so that the polydiacetylene layers 52 having a high degree of orientation are obtained. There is no specific limitation on the solvent usable for the PCDA solution. Usable solvents include tetrahydrofuran, toluene, xylene, dioxane, chloroform, dichloromethane, etc., and a mixed solvent thereof. The volumetric ratio (partial pressure) of the solvent vapor with respect to the atmosphere of the element substrate supplied with the PCDA solution may be adjusted, so that the rate at which the solvent is removed is adjusted (see, for example, Japanese Laid-Open Patent Publication No. 2009-224620).

A liquid crystal display device or the like uses an insulating color filter, whereas the first polydiacetylene layer 52a and the second polydiacetylene layer 52b are semiconductive and therefore, are difficult to be charged. Especially, the voltage applied to cause the blue pixels to emit light is higher than for the other colors of pixels. Therefore, the blue pixels are especially easily chargeable. The provision of the first polydiacetylene layer 52a provides an effect of suppressing the blue pixels from being charged. In addition, the measures against electrostatic discharge (ESD) may be omitted or alleviated. It is preferred that the first polydiacetylene layer 52a has a specific resistance smaller than, or equal to, $0.1 \times 10^{-1}$ Ωcm.

INDUSTRIAL APPLICABILITY

An embodiment of the present invention is applicable to an organic EL display device, specifically, a flexible organic EL display device, and a method for producing the same.

REFERENCE SIGNS LIST 1 substrate (flexible substrate)
2 circuit
3 OLED layer
4 polarizing plate
10 TFE structure
12 first inorganic barrier layer (SiN layer)
14 organic barrier layer
14a pixel periphery solid portion
16 second inorganic barrier layer (SiN layer)
30 lead wire
38 terminal
42 lower electrode
44 organic layer
46 upper electrode 48 bank layer
52 polydiacetylene layer
52a first polydiacetylene layer
52b second polydiacetylene layer
100 OLED display device
BS bank structure
P particle
Pix pixel
R1 active region
R2 peripheral region

The invention claimed is:

1. A method for producing an organic EL display device including a plurality of pixels, the organic EL display device comprising:
    an element substrate including a substrate, a plurality of organic EL elements supported by the substrate and respectively located in the plurality of pixels, and a bank layer defining the plurality of pixels; and
    a thin film encapsulation structure covering the plurality of pixels,
    wherein the thin film encapsulation structure includes a first inorganic barrier layer and an organic barrier layer in contact with a top surface or a bottom surface of the first inorganic barrier layer,
    wherein the plurality of pixels include a red pixel, a green pixel and a blue pixel,
    wherein the organic EL display device further includes a first polydiacetylene layer selectively provided on the thin film encapsulation structure on the blue pixel and exhibiting a blue color and a second polydiacetylene layer selectively provided on the thin film encapsulation structure on the red pixel and exhibiting a red color, and
    wherein the first and second polydiacetylene layers are formed of a polymer of 10,12-pentacosadiynoic acid, wherein a step of forming the first and second polydiacetylene layers includes the steps of:
    after the thin film encapsulation structure is formed, depositing 10,12-pentacosadiynoic acid on the thin film encapsulation structure by mask vapor deposition;
    irradiating the 10,12-pentacosadiynoic acid with an electron beam or ultraviolet rays to form a polydiacetylene layer exhibiting a blue color; and
    further irradiating only a region, of the polydiacetylene layer, to be the second polydiacetylene layer with the ultraviolet rays to change the region to a polydiacetylene layer exhibiting a red color by phase transition, and wherein the step of forming the thin film encapsulation structure includes the steps of:
    preparing, in a chamber, the element substrate on which the first inorganic barrier layer is formed,
    supplying a vapor-like or mist-like photocurable resin into the chamber,
    condensing the photocurable resin on the first inorganic barrier layer to form a liquid film,
    irradiating the liquid film of the photocurable resin with light to form a photocured resin layer, and
    partially ashing the photocured resin layer to form the organic barrier layer.

2. The method of claim 1, wherein the step of forming the thin film encapsulation structure includes the step of forming a silicon nitride layer, and
    wherein after the silicon nitride layer is formed, the 10,12-pentacosadiynoic acid is deposited by the mask vapor deposition without exposing the silicon nitride layer to the atmosphere.

3. The method of claim 1, wherein the organic barrier layer included in the thin film encapsulation structure is in contact with the top surface of the first inorganic barrier layer and includes a plurality of solid portions distributed discretely,
    wherein the thin film encapsulation structure further includes a second inorganic barrier layer in contact with the top surface of the first inorganic barrier layer and top surfaces of the plurality of solid portions of the organic barrier layer, and
    the first and second polydiacetylene layers are formed on the second inorganic barrier layer.

4. The method of claim 1, wherein the first and second polydiacetylene layers are semiconductive.

5. The method of claim 4, wherein the first polydiacetylene layer has a specific resistance smaller than, or equal to, $1 \times 10^{-1}$ Ωcm.

6. The method of claim 1, further comprising an ultraviolet absorbing layer located on the first and second polydiacetylene layers.

7. The method of claim 1, wherein the first inorganic barrier layer is formed of silicon nitride.

8. The method of claim 1, wherein the first and second polydiacetylene layers each have a thickness of 0.5 μm or greater and 2.0 μm or less.

9. The method of claim 1, wherein the first polydiacetylene layer provides a transmission spectrum of blue light in which the blue light has a peak wavelength in the range of 460 nm or longer and 470 nm or shorter.

10. The method of claim 9, wherein the first polydiacetylene layer has a transmittance for the blue light higher than, or equal to, 80% at the peak wavelength thereof.

11. The method of claim 1, wherein the second polydiacetylene layer provides a transmission spectrum of red light in which the red light has a peak wavelength in the range of 610 nm or longer and 630 nm or shorter.

12. The method of claim 11, wherein the second polydiacetylene layer has a transmittance for the red light higher than, or equal to, 90% at the peak wavelength thereof.

* * * * *